(12) United States Patent
Sentoku et al.

(10) Patent No.: US 10,401,744 B2
(45) Date of Patent: Sep. 3, 2019

(54) CALIBRATION METHOD, MEASUREMENT APPARATUS, EXPOSURE APPARATUS, AND METHOD OF MANUFACTURING ARTICLE

(71) Applicant: CANON KABUSHIKI KAISHA, Tokyo (JP)

(72) Inventors: Koichi Sentoku, Kawachi-gun (JP); Yoshinori Ohsaki, Utsunomiya (JP); Osamu Morimoto, Utsunomiya (JP); Takahiro Matsumoto, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 339 days.

(21) Appl. No.: 14/324,806

(22) Filed: Jul. 7, 2014

(65) Prior Publication Data

US 2015/0015861 A1    Jan. 15, 2015

(30) Foreign Application Priority Data

Jul. 9, 2013    (JP) .................................. 2013-143894

(51) Int. Cl.
*G03B 27/58*    (2006.01)
*G03F 7/20*    (2006.01)
*G01D 5/244*    (2006.01)

(52) U.S. Cl.
CPC ..... *G03F 7/70775* (2013.01); *G01D 5/24452* (2013.01); *G03F 7/7085* (2013.01);
(Continued)

(58) Field of Classification Search
CPC ............ G01D 5/24452; G03F 7/70058; G03F 7/70516; G03F 7/70775; G03F 7/70533;
(Continued)

(56) References Cited

U.S. PATENT DOCUMENTS

| 5,325,180 A | 6/1994 | Chappelow et al. |
| 7,025,498 B2* | 4/2006 | del Puerto ........ H01L 21/67265 250/200 |

(Continued)

FOREIGN PATENT DOCUMENTS

| JP | 2003031462 A | 1/2003 |
| JP | 2004279670 A | 10/2004 |

(Continued)

OTHER PUBLICATIONS

Office Action issued in TW103121714, dated Dec. 10, 2015. English translation provided.

(Continued)

*Primary Examiner* — Christina A Riddle
(74) *Attorney, Agent, or Firm* — Rossi, Kimms & McDowell LLP (57) ABSTRACT

The present invention provides a method for calibrating an encoder which includes a scale and a light receiving unit configured to receive light reflected by the scale, and detects a change in relative position between the scale and the light receiving unit, the method comprising a measurement step of measuring a deformation amount of a surface shape of the scale, a specifying step of specifying, based on a measurement result in the measurement step, a range which includes a portion of a surface of the scale, where the deformation amount exceeds a threshold, and within which a detection value of the encoder is corrected, and a determination step of determining a correction value for correcting the detection value of the encoder within the range specified in the specifying step.

12 Claims, 11 Drawing Sheets

(52) U.S. Cl.
 CPC ...... *G03F 7/70516* (2013.01); *G03F 7/70533* (2013.01); *G03F 7/70541* (2013.01); *G03F 7/70725* (2013.01); *G03F 7/70858* (2013.01)

(58) Field of Classification Search
 CPC ............ G03F 7/70541; G03F 7/70716; G03F 7/70725; G03F 7/70783; G03F 7/7085; G03F 7/70858; G03F 7/70825; G03F 7/70875; G03F 7/70891; G03F 7/7095; G03F 9/7007; G03F 9/7019; G03F 9/7023–7034; G03F 9/7049
 USPC ......... 355/77, 30, 52, 53, 55, 67–71, 72–74; 250/231.1, 492.22, 548; 430/5, 8, 22, 30, 430/311, 320; 356/399–401
 See application file for complete search history.

(56) References Cited

U.S. PATENT DOCUMENTS

| | | | |
|---|---|---|---|
| 8,786,829 | B2 | 7/2014 | Kanaya |
| 8,903,156 | B2 | 12/2014 | Van De Mast et al. |
| 8,937,710 | B2 | 1/2015 | Shibazaki |
| 9,423,702 | B2 | 8/2016 | Shibazaki |
| 2003/0052260 | A1* | 3/2003 | Grimes .............. G01D 5/34707 250/231.13 |
| 2005/0151951 | A1 | 7/2005 | Hill |
| 2006/0227309 | A1 | 10/2006 | Loopstra et al. |
| 2006/0290914 | A1 | 12/2006 | Van Der Pasch et al. |
| 2007/0081134 | A1 | 4/2007 | Amano |
| 2007/0288121 | A1* | 12/2007 | Shibazaki ........... G03F 7/70516 700/213 |
| 2008/0094592 | A1* | 4/2008 | Shibazaki ........... G03F 7/70725 355/53 |
| 2008/0101684 | A1 | 5/2008 | Roux |
| 2008/0240501 | A1* | 10/2008 | Van Der Wijst .... G03F 7/70425 382/103 |
| 2009/0262326 | A1* | 10/2009 | Butler ................ G03F 7/70775 355/72 |
| 2009/0284717 | A1* | 11/2009 | Kanaya ............... G03F 7/70775 355/30 |
| 2010/0007867 | A1* | 1/2010 | Van Den Brink .. G03F 7/70775 355/72 |

FOREIGN PATENT DOCUMENTS

| | | |
|---|---|---|
| JP | 2006344614 A | 12/2006 |
| JP | 2007-004175 A | 1/2007 |
| JP | 2007103882 A | 4/2007 |
| JP | 2007-129194 A | 5/2007 |
| JP | 2008-112160 A | 5/2008 |
| JP | 2009252985 A | 10/2009 |
| JP | 2012208937 A | 10/2012 |
| JP | 2013034014 A | 2/2013 |
| JP | 2013045815 A | 3/2013 |
| JP | 2013098355 A | 5/2013 |
| KR | 20090063178 A | 6/2009 |
| TW | 200739676 A | 10/2007 |
| TW | 200951644 A | 12/2009 |
| TW | 201237742 A | 9/2012 |

OTHER PUBLICATIONS

English translation of Office Action issued in Japanese Appln. No. 2013-143894 dated Dec. 15, 2017, previously cited in IDS filed Dec. 22, 2017.

* cited by examiner

CALIBRATION METHOD, MEASUREMENT APPARATUS, EXPOSURE APPARATUS, AND METHOD OF MANUFACTURING ARTICLE

BACKGROUND OF THE INVENTION

Field of the Invention

The present invention relates to a calibration method for an encoder, a measurement apparatus using an encoder, an exposure apparatus, and a method of manufacturing an article.

Description of the Related Art

An exposure apparatus for forming a pattern on a substrate is required to accurately position a stage for holding a substrate. To achieve this, it is important to accurately measure the position of the stage. An exposure apparatus may use an encoder to measure the position of a stage, as described in Japanese Patent Laid-Open No. 2007-129194. The encoder includes a scale, and a light receiving unit which radiates the surface of the scale with light and receives reflected light, and can detect the relative position between the scale and the light receiving unit.

However, if the surface of the scale deforms, the deformation causes detection errors in the encoder, thereby making it difficult to accurately position the stage. To solve this problem, Japanese Patent Laid-Open Nos. 2007-004175 and 2008-112160 propose a method in which an exposure apparatus using an encoder forms a pattern on an evaluation substrate, and calibrates the encoder based on the pattern formed on the evaluation substrate.

A scale may have partially deformed. In this case, calibrating the scale over the entire surface of the scale means that calibration is performed in a portion of the scale where no detection errors of the encoder occur, thereby decreasing the efficiency.

SUMMARY OF THE INVENTION

The present invention provides, for example, a technique advantageous in calibrating an encoder.

According to one aspect of the present invention, there is provided a method for calibrating an encoder which includes a scale and a light receiving unit configured to receive light reflected by the scale and detects a change in relative position between the scale and the light receiving unit, the method comprising: a measurement step of measuring a deformation amount of a surface shape of the scale; a specifying step of specifying, based on a measurement result in the measurement step, a range which includes a portion of a surface of the scale, where the deformation amount exceeds a threshold, and within which a detection value of the encoder is corrected; and a determination step of determining a correction value for correcting the detection value of the encoder within the range specified in the specifying step.

Further features if the present invention will become apparent from the following description of exemplary embodiments with reference to the attached drawings.

DESCRIPTION OF THE EMBODIMENTS

Exemplary embodiments of the present invention will be described below with reference to the accompanying drawings. Note that the same reference numerals denote the same members throughout the drawings, and a repetitive description thereof will not be given. In the following embodiments, an example of an exposure apparatus will be described. The present invention, however, is not limited to this, and is applicable to other lithography apparatuses such as a drawing apparatus and imprint apparatus.

First Embodiment

Figure 1:
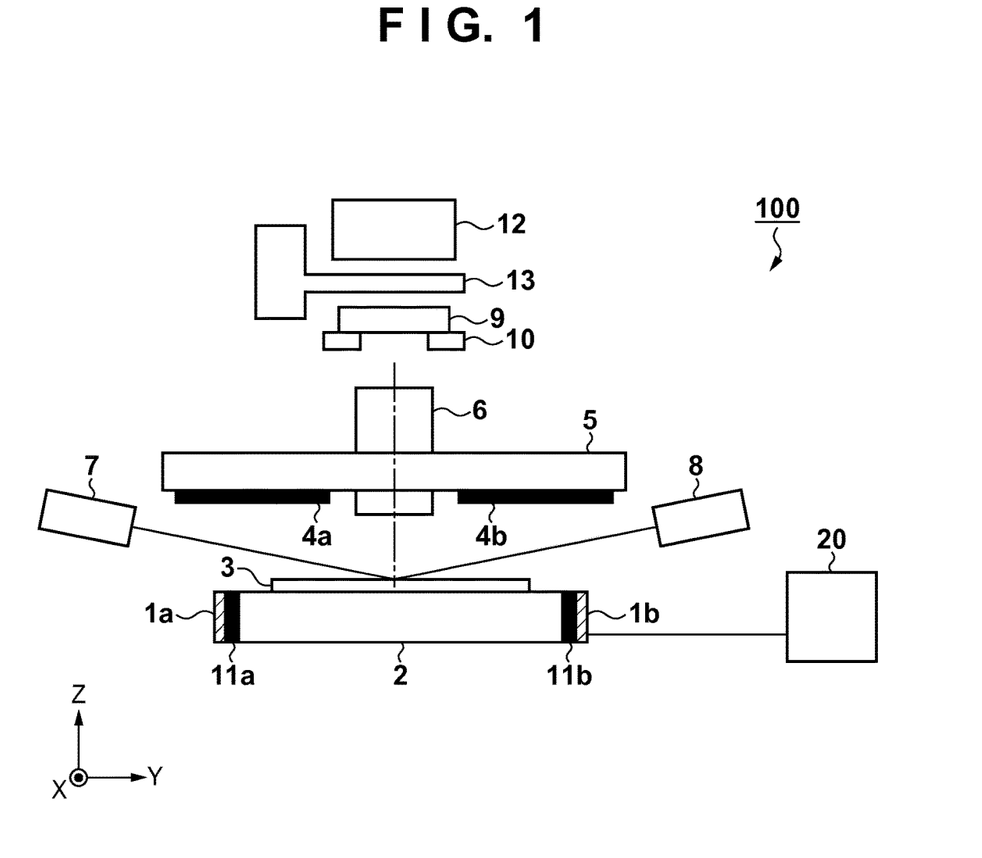
FIG. 1 is a schematic view showing calibration of an exposure apparatus.

A calibration method for an encoder according to the first embodiment will be explained. In the first embodiment, an exposure apparatus 100 for positioning, using an encoder, a stage 2 for holding a substrate 3 will be exemplified. FIG. 1 is a schematic view showing the arrangement of the exposure apparatus 100. The exposure apparatus 100 includes the stage 2 which is movable while holding the substrate 3, a projection optical system 6 for projecting the pattern of a mask 9 onto the substrate 3, a mask holding unit 10 for holding the mask 9, an illumination optical system 12 for irradiating the mask 9 with light, and a control unit 20. The exposure apparatus 100 also includes an alignment scope 13 for detecting the alignment marks of the substrate 3 via the projection optical system 6, and a focus measurement unit 7 for measuring the height (the position in the Z direction) of the substrate 3. The focus measurement unit 7 includes an irradiation unit 7a for irradiating the substrate 3 with light, and a light receiving unit 8 for receiving light reflected by the substrate 3. The control unit 20 includes a CPU and a memory, and controls exposure processing for the substrate 3 (controls each unit of the exposure apparatus 100).

The minimum size of a pattern to be transferred to the substrate 3 using the exposure apparatus 100 is known to be proportional to the wavelength of light used for transferring, and to the inversely proportional to the numerical aperture of the projection optical system 6. For the exposure apparatus 100, therefore, the wavelength of light is becoming shorter in the order of, for example, a mercury lamp i-line (wavelength: 355 nm), a KrF excimer laser (wavelength: 248 nm), and an ArF excimer laser (wavelength: 193 nm). The exposure apparatus 100 for transferring such fine pattern is required to more accurately position the stage 2 as the wavelength of light is shorter. To do this, it is important to accurately measure the position of the stage 2.

The exposure apparatus 100 of the first embodiment uses the encoder as a measurement apparatus for measuring the position of the stage 2 (object). The encoder of the first embodiment includes scales 4 and light receiving units 1, as shown in FIG. 1. Each scale 4 is formed by, for example, a glass substrate having, on its surface, a line pattern which includes a plurality of lines regularly arranged in directions (X and Y directions) parallel to the surface of the scale 4. In the exposure apparatus 100, the plurality of scales 4 (scales 4a and 4b in FIG. 1) are attached to a plate 5 fixed to the projection optical system 6. The scales 4 may be attached to the plate 5 by electrostatic chucking or vacuum chucking, by using an adhesive or an optical contact method, or by a mechanical clamp method. As shown in FIG. 1, the light receiving units 1 are attached to, for example, the four corners of the stage 2 (light receiving units 1a and 1b in FIG. 1), and respectively irradiate the corresponding scales 4 with light and receive reflected light. For example, each light receiving unit 1 sequentially receives light from the line pattern on the corresponding scale 4 and light from a portion except for the line pattern by receiving light from the scale 4 while the stage 2 moves. The light receiving unit 1 then outputs a signal indicating a light intensity in the moving directions (X and Y directions) of the stage 2. This enables the control unit 20 to obtain a change in relative position between the scale 4 and the light receiving unit 1, that is, the displacement amount of the stage 2 based on the signal and the interval between the plurality of lines of the line pattern.

As described above, the exposure apparatus 100 using the encoder obtains the displacement amount of the stage 2 with reference to the interval between the plurality of lines arranged on the surface of the scale 4, and then positions the stage 2. However, the interval between the plurality of lines may partially change as the surface shape of the scale 4 temporally changes. A change in the interval between the plurality of lines may cause an error in the displacement amount of the stage 2 detected by the encoder, thereby making it difficult to accurately position the stage 2. It is, therefore, important for the exposure apparatus 100 using the encoder to calibrate the encoder so as to decrease detection errors of the encoder (so that detection errors of the encoder fall within a tolerance range).

To achieve this, in the first embodiment, measurement units 11 each for measuring the surface shape of the corresponding scale 4 are included together with the encoder as a measurement apparatus for measuring the position of the stage 2. The measurement units 11 are supported by the stage 2, and respectively arranged adjacent to the light receiving units 1. Each measurement unit 11 includes, for example, a laser interferometer configured to irradiate the corresponding scale 4 with a laser beam. The laser interferometer irradiates the scale 4 and a reference surface with laser beams, and detects the displacement amount of the surface of the scale 4 in the Z direction with respect to a reference position based on interference between a laser beam reflected by the scale 4 and that reflected by the reference surface. Each measurement unit 11 can measure the surface shape of the corresponding scale 4 by obtaining the displacement amount in the Z direction at a plurality of positions on the scale 4 using the laser interferometer. In FIG. 1, the measurement unit 11 is arranged between the stage 2 and the light receiving unit 1. However, the measurement unit 11 may be arranged outside the light receiving unit 1.

Figure 2:
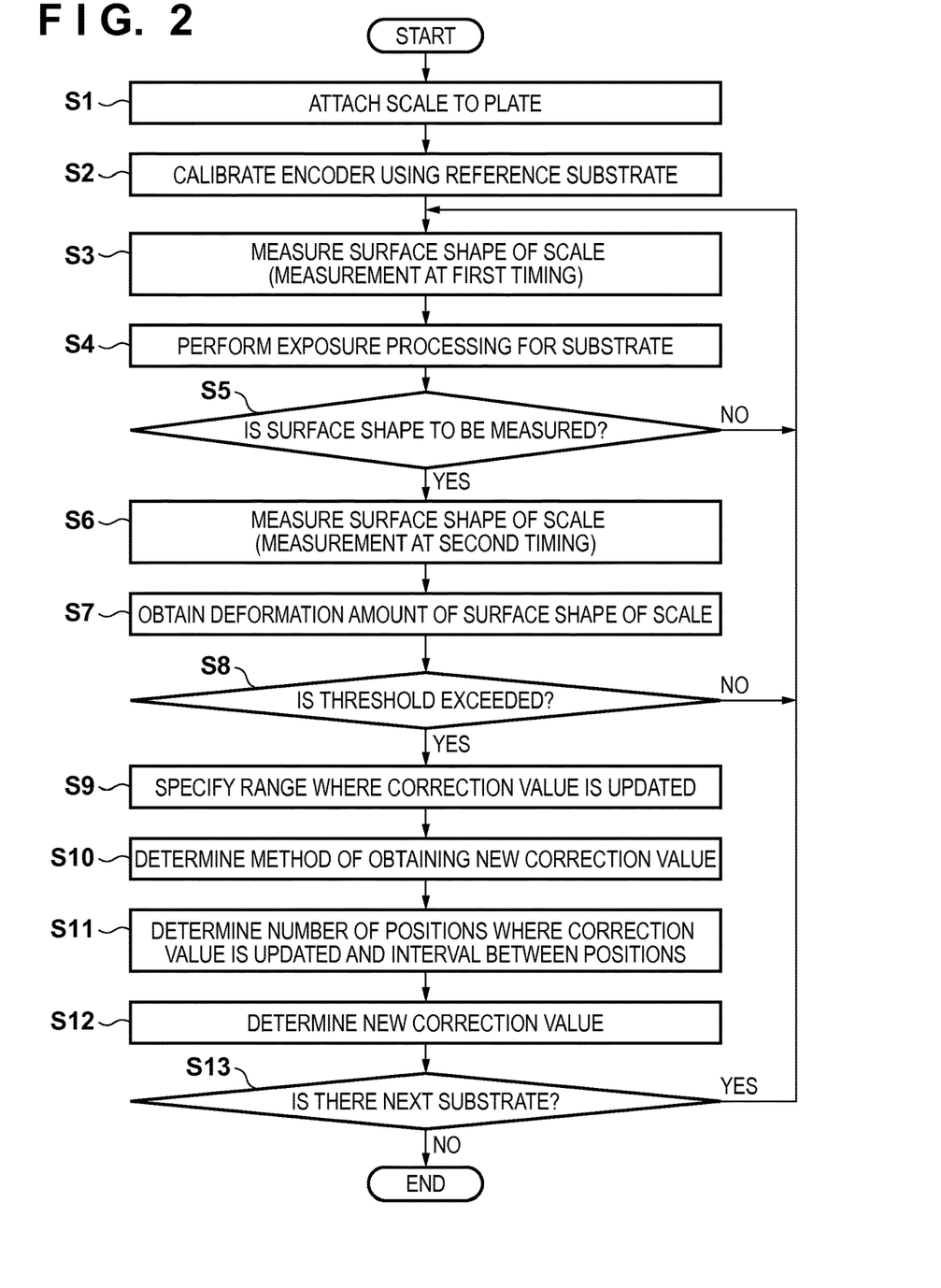
FIG. 2 is a flowchart illustrating a procedure up to determination of a correction value for correcting the detection value of an encoder.

The calibration method for the encoder according to the first embodiment will be described with reference to FIG. 2. FIG. 2 is a flowchart illustrating a procedure from a step of attaching each scale 4 to the plate 5 to a step of deciding a correction value for correcting the detection value of the encoder.

In step S1, each scale 4 is attached to the plate 5. In step S2, a reference substrate is mounted on the stage 2, and the encoder is calibrated using the reference substrate. The interval between the plurality of lines of the scale 4 attached to the plate 5 may be different from a design value due to the shape of the chucking surface (adhesive surface) of the plate 5 and the manufacturing error of the scale 4. In this case, detection errors (to be referred to as errors at the time of attachment hereinafter) unwantedly occur in the encoder. It is, therefore, necessary to calibrate the encoder using the reference substrate so that the errors at the time of attachment fall within a tolerance range.

The reference substrate is held by the stage 2, similarly to the substrate 3, and has, on its entire surface, a plurality of marks formed at a given interval. The interval between the marks of the reference substrate is measured in advance by, for example, a distance measurement apparatus outside the exposure apparatus 100. The control unit 20 causes the alignment scope 13 to detect the marks of the reference substrate via the projection optical system 6 while moving the stage 2 in the X and Y directions, and also causes the encoder to detect the displacement amount of the stage 2 in the X and Y directions. The control unit 20 calculates the interval between the marks of the reference substrate based on the detection result of the encoder and that of the alignment scope 13, and compares the calculated mark interval with the mark interval measured in advance. If the calculated mark interval is different from the mark interval measured in advance, the control unit 20 determines that the errors at the time of attachment have occurred. The control unit 20 then determines a correction value for correcting the detection value of the encoder so that the calculated mark interval becomes close to the mark interval measured in advance. The thus determined correction value is associated with a position on the scale 4, and stored in, for example, the control unit 20 or an external storage device. This makes it possible to calibrate the encoder so that the errors at the time of attachment fall within the tolerance range.

In step S3, the measurement unit 11 measures the surface shape of the scale 4 (measurement at the first timing). In step S3, while moving the stage 2 in the X and Y directions, measurement of the surface shape of the scale 4 by the measurement unit 11 is performed simultaneously with measurement of the position of the reference substrate in the Z direction by the focus measurement unit 7. At this time, by setting the position of the reference substrate in the Z direction as a reference position, the measurement unit 11 measures the surface shape of the scale 4 based on the displacement amount of the surface of the scale 4 in the Z direction with respect to the reference position. While the stage 2 moves in the X and Y directions, however, the reference substrate may fluctuate in the Z direction, and thus a measurement error may occur in the measurement unit 11. The exposure apparatus 100 of the first embodiment causes the focus measurement unit 7 to measure the position of the reference substrate in the Z direction, and corrects the measurement error of the measurement unit 11 due to the fluctuation of the reference substrate (reference position), thereby accurately measuring the surface shape of the scale 4. The thus measured surface shape of the scale 4 is stored in, for example, the control unit 20 or an external storage device.

In step S4, the substrate 3 on which a pattern is to be formed (the substrate 3 to undergo exposure processing) is mounted on the stage, and undergoes exposure processing. In step S5, it is determined whether to measure the surface shape of the scale 4. If, for example, the number of substrates 3 having undergone exposure processing exceeds a predetermined number, or the time elapsed after step S3 in which the surface shape of the scale 4 is measured exceeds a predetermined time, the control unit 20 determines to measure the surface shape of the scale 4. If the control unit 20 determines not to measure the surface shape of the scale 4 (NO), the process returns to step S4, and a new substrate 3 is mounted on the stage, and undergoes exposure processing. On the other hand, if the control unit 20 determines to measure the surface shape of the scale 4 (YES), the process advances to step S6.

In Step S6, the reference substrate is mounted on the stage again, and the measurement unit 11 measures the surface shape of the scale (measurement at the second timing). In step S6, while moving the stage 2 in the X and Y directions, measurement of the surface shape of the scale 4 by the measurement unit 11 is performed simultaneously with measurement of the position of the reference substrate in the Z direction by the focus measurement unit 7, similarly to step S3. The thus measured surface shape of the scale 4 is stored in, for example, the control unit 20 or an external storage device. In step S7, the difference between the measurement result of the measurement unit 11 at the first timing and that at the second timing is obtained as an amount (deformation amount) by which the surface shape of the scale has temporally changed. In step S8, it is determined whether the deformation amount of the surface shape of the scale 4 exceeds a threshold. The threshold can be set in advance according to the positioning accuracy of the stage and the like. If the control unit 20 determines that the deformation amount of the surface shape of the scale 4 does not exceed the threshold (NO), the process returns to step S4, and a new substrate 3 is mounted on the stage, and undergoes exposure processing. On the other hand, if the control unit 20 determines that the deformation amount of the surface shape of the scale 4 exceeds the threshold (YES), the process advances to step S9.

Figure 3:
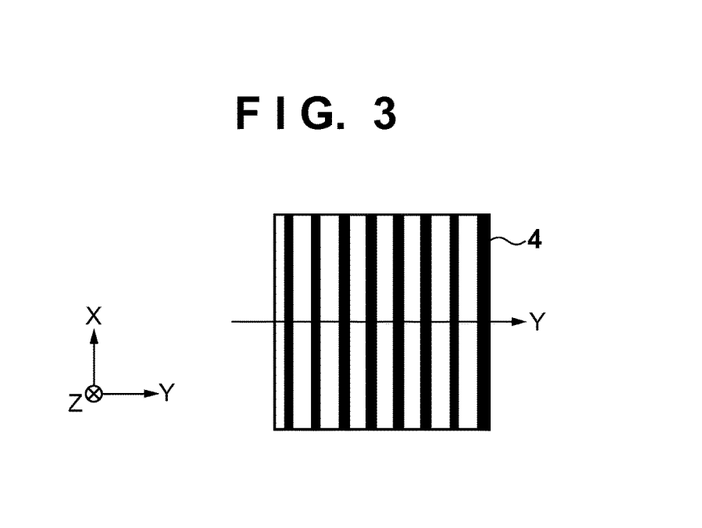
FIG. 3 is a view showing an example of a scale.

In step S9, a range (to be referred to as a correction range hereinafter) within which the detection value of the encoder is corrected (updated) is specified so as to include a portion of the surface of the scale 4, where the deformation amount exceeds the threshold. A method of specifying the correction range will now be described. When the measurement unit 11 measures the surface shape of the scale 4 in the Y direction by moving the stage 2 in the Y direction, for example, the scale 4 includes the line pattern which includes a plurality of lines arranged at a given interval in the Y direction, as shown in FIG. 3. The scale 4 may be configured so that a plurality of lines are arranged in a direction forming an angle of 45° with respect to the Y direction. In this case, the measurement unit 11 can measure the surface shape of the scale 4 in each of the X and Y directions by moving the stage 2 in the X and Y directions.

Figure 4:
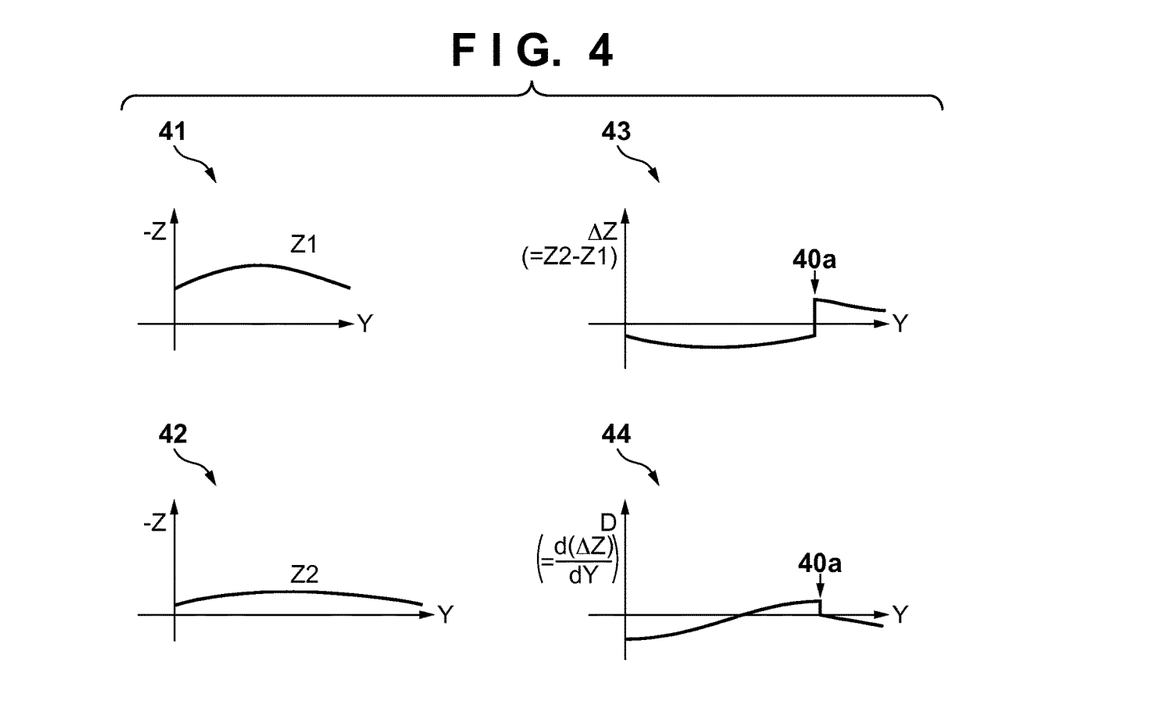
FIG. 4 is a view showing a measurement result for a deformation example of the scale.

FIG. 4 shows the result of measuring the surface shape of the scale 4 in the Y direction by the measurement unit 11. Referring to FIG. 4, 41 shows the measurement result (measurement result in step S3) of a surface shape Z1 of the scale 4 at the first timing, and 42 shows the measurement result (measurement result in step S6) of a surface shape Z2 of the scale 4 at the second timing. Note that the surface shape of the scale 4 is obtained by simultaneously performing measurement of the surface shape of the scale 4 by the measurement unit 11 and measurement of the position of the reference substrate in the Z direction by the focus measurement unit 7 while moving the stage 2, as described above.

As shown in 41 of FIG. 4, the surface shape Z1 of the scale at the first timing indicates a state in which the central portion of the scale 4 protrudes as compared with its peripheral portion (a convex state in the Z direction). The surface shape Z2 of the scale at the second timing after exposure processing is performed indicates a state in which the scale expands in the Y direction as a whole, as compared with the surface shape Z1 of the scale at the first timing. As shown in 43 of FIG. 4, the control unit 20 obtains the difference between the surface shape Z1 of the scale at the first timing and the surface shape Z2 of the scale at the second timing, that is, a deformation amount $\Delta Z$ of the scale. The control unit 20 obtains a derivative value D of the deformation amount by differentiating the deformation amount $\Delta Z$ shown in 43 of FIG. 4, as shown in 44 of FIG. 4. By obtaining the deformation amount $\Delta Z$ of the scale 4 and the derivative value D in this way, the control unit 20 can determine the deformation state of the scale based on 43 and 44 of FIG. 4. For example, in 43 and 44 of FIG. 4, there is a portion 40a where the deformation amount $\Delta Z$ and the derivative value D suddenly change, and it can be seen that the deformation amount $\Delta Z$ and the derivative value D are not zero over the entire surface. If such tendency is seen, the control unit 20 can determine that the scale 4 uniformly expands in the Y direction and detection errors of the encoder have occurred over the entire surface of the scale 4. Based on the determination, the control unit 20 specifies the entire surface of the scale 4 as the correction range.

Figure 5:
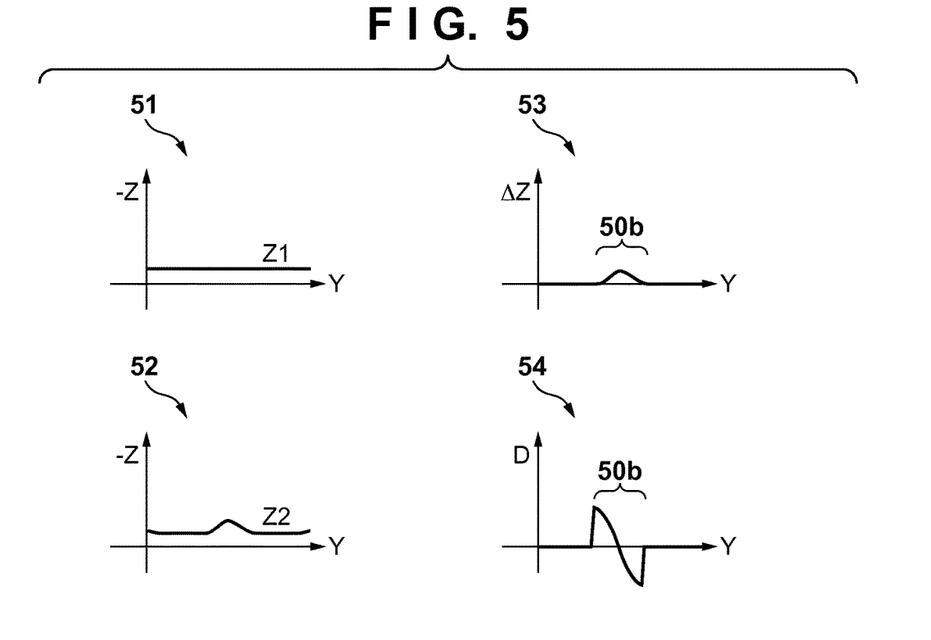
FIG. 5 is a view showing a measurement result for another deformation example of the scale.

A case in which the deformation state of the scale 4 is determined based on the deformation amount $\Delta Z$ of the scale 4 and the derivative value D will be explained below with reference to FIGS. 5 to 8. A case in which the scale has not expanded or contracted but has partially deformed will be described first with reference to FIG. 5. Referring to FIG. 5, 51 shows the measurement result (measurement result in step S3) of the surface shape Z1 of the scale 4 at the first timing, and 52 shows the measurement result (measurement result in step S6) of the surface shape Z2 of the scale 4 at the second timing. In this case, the surface shape Z2 of the scale 4 at the second timing has partially deformed, as compared with the surface shape Z1 of the scale 4 at the first timing. The control unit 20 obtains 53 and 54 of FIG. 5 by obtaining the deformation amount $\Delta Z$ of the scale 4 and the derivative value D. In 53 and 54 of FIG. 5, there is a portion 50b where the deformation amount $\Delta Z$ and the derivative value D partially change. The control unit 20 can, therefore, determine that the surface of the scale 4 has partially deformed and detection errors of the encoder have occurred in the portion 50b. If a value in the portion 50b exceeds a threshold, the control unit 20 specifies a range including the portion 50b as the correction range based on the determination.

Figure 6:
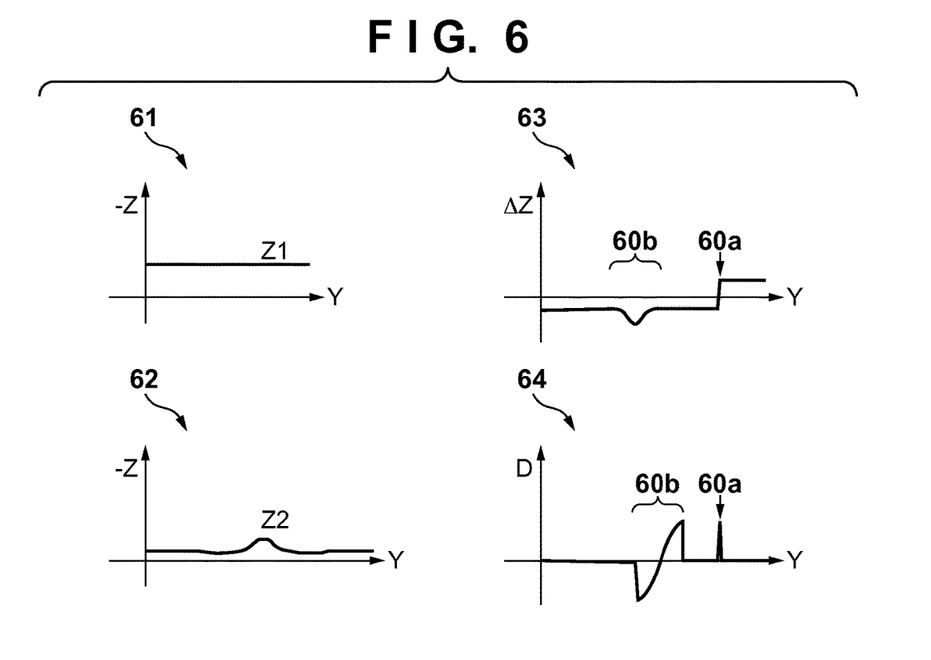
FIG. 6 is a view showing a measurement result for still another deformation example of the scale.

A case in which the scale 4 has uniformly expanded and contacted and partially deformed will be described with reference to FIG. 6. Referring to FIG. 6, 61 shows the measurement result (measurement result in step S3) of the surface shape Z1 of the scale 4 at the first timing, and 62 shows the measurement result (measurement result in step S6) of the surface shape Z2 of the scale 4 at the second timing. The surface shape Z2 of the scale at the second timing has uniformly expanded in the Y direction and partially deformed, as compared with the surface shape Z1 of the scale at the first timing. In this case, in 63 and 64 of FIG. 6 which respectively show the deformation amount ΔZ and the derivative value D, there is a portion 60a where the values suddenly change and a portion 60b where the values partially change. Based on the portions 60a and 60b, the control unit 20 can determine that the scale 4 has uniformly expanded in the Y direction, the surface of the scale 4 has partially deformed, and detection errors of the encoder have occurred over the entire surface of the scale 4. Based on the determination, the control unit 20 specifies the entire surface of the scale 4 as the correction range.

Figure 7:
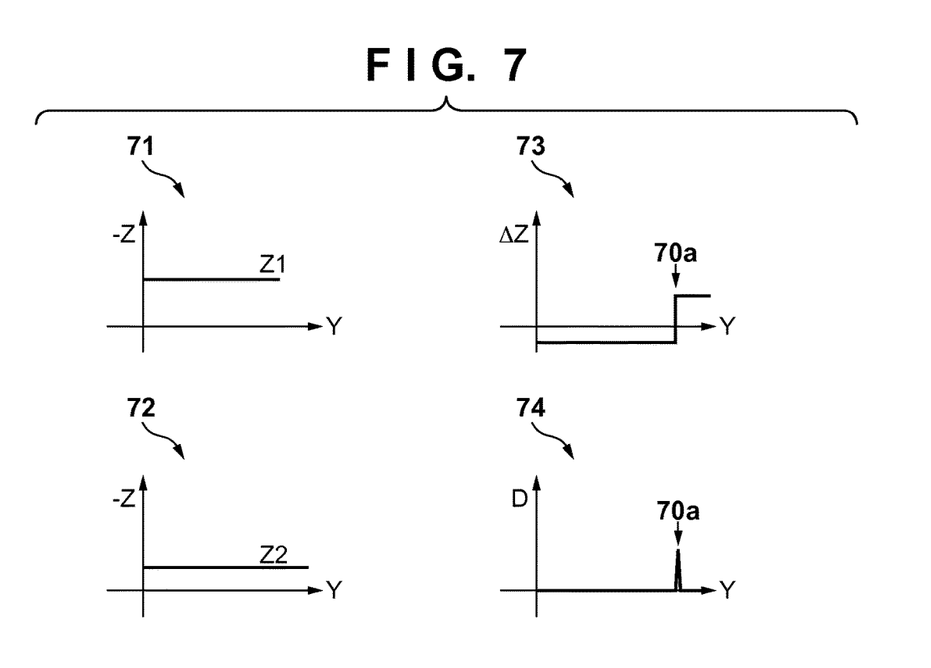
FIG. 7 is a view showing a measurement result for still another deformation example of the scale.

A case in which the scale has uniformly expanded and contracted will be described with reference to FIG. 7. Referring to FIG. 7, 71 shows the measurement result (measurement result in step S3) of the surface shape Z1 of the scale at the first timing, and 72 shows the measurement result (measurement result in step S6) of the surface shape Z2 of the scale at the second timing. Furthermore, 73 and 74 of FIG. 7 show the deformation amount ΔZ of the scale 4 and the deviation value D, respectively. Since, in 73 and 74 of FIG. 7, there is a portion 70a where the values suddenly change, the control unit 20 determines that the scale 4 has uniformly expanded in the Y direction and detection errors of the encoder have occurred over the entire surface of the scale 4. Based on the determination, the control unit 20 specifies the entire surface of the scale 4 as the correction range.

Figure 8:
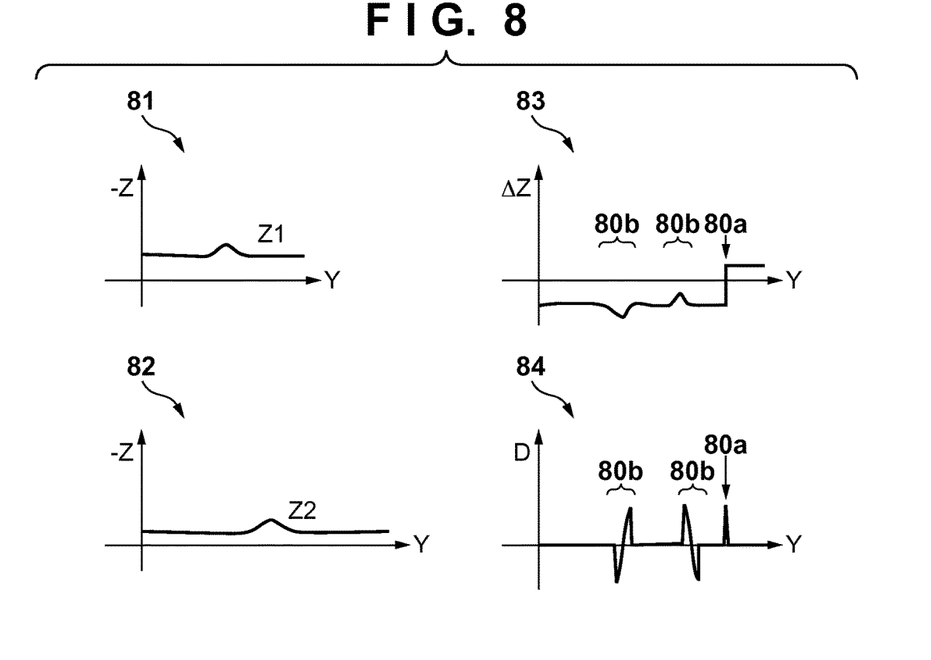
FIG. 8 is a view showing a measurement result for still another deformation example of the scale.

A case in which the scale 4 has already, partially deformed at the first timing, and has uniformly expanded and contracted over time will be described with reference to FIG. 8. Referring to FIG. 8, 81 shows the measurement result (measurement result in step S3) of the surface shape Z1 of the scale 4 at the first timing, and 82 shows the measurement result (measurement result in step S6) of the surface shape Z2 of the scale 4 at the second timing. In 83 and 84 of FIG. 8 which respectively show the deformation amount ΔZ of the scale 4 and the deviation value D, there is a portion 80a where the values suddenly change and a portion 80b where the values partially change. Based on the portions 80a and 80b, the control unit 20 can determine that the scale 4 has uniformly expanded in the Y direction, the surface of the scale 4 has partially deformed, and detection errors of the encoder have occurred over the entire surface of the scale 4. Based on the determination, the control unit 20 specifies the entire surface of the scale 4 as the correction range.

As described above, it is possible to grasp the deformation state of the scale 4 by obtaining the deformation amount ΔZ as the difference between the surface shape Z1 at the first timing and the surface shape Z2 at the second timing, and the derivative value D of the deformation amount ΔZ. The control unit 20 then determines the deformation state of the scale 4 based on a portion where the deformation amount ΔZ and the derivative value D have changed, and specifies the correction range. For example, when the scale 4 uniformly expands and contracts, the control unit 20 specifies the entire surface of the scale 4 as the correction range. When the scale 4 partially deforms, the control unit 20 specifies a range including the deformed portion of the scale 4 as the correction range.

Referring back to the flowchart shown in FIG. 2, the calibration method for the encoder will be described. In step S10, a method of obtaining a new correction value for correcting the detection value of the encoder is determined. Examples of a method of obtaining a new correction value are a method of obtaining a correction value by using the reference substrate and measuring the marks formed on the reference substrate, as described with reference to step S2, and a method of obtaining a correction value by calculation using the deformation amount obtained in step S7. The former method is as described with reference to step S2 and a description thereof will be omitted. The latter method will be described later.

In step S11, within the correction range, the number of positions where the correction value is updated and the interval between the plurality of positions where the correction value is updated are determined. For example, if the deformation amount ΔZ of the scale 4 is smaller than a reference value, the interval between the plurality of positions is lengthened, and the number of positions is accordingly decreased. On the other hand, if the deformation amount ΔZ of the scale 4 is larger than the reference value, the interval between the plurality of positions is shortened, and the number of positions is accordingly increased. In step S12, within the correction range specified in step S9, a new correction value is determined based on the method determined in step S10, and the number of positions where the correction value is updated and the interval between the positions, which have been determined in step S11. The thus determined new correction value is associated with the position on the scale 4, and stored in, for example, the control unit 20 or an external storage device. In this case, the control unit 20 updates the correction value determined in step S2 or a previously updated correction value with the new correction value determined in step S12. At this time, if step S2 is not executed and no correction value is set, the new correction value determined in step S12 is set intact. In step S13, it is determined whether there is a substrate 3 (to be referred to as a next substrate 3 hereinafter) to undergo exposure processing next. If there is a next substrate 3, the process returns to step S4, the next substrate 3 is mounted on the stage 2, and undergoes exposure processing. On the other hand, if there is no next substrate 3, the process ends.

Figure 9A:
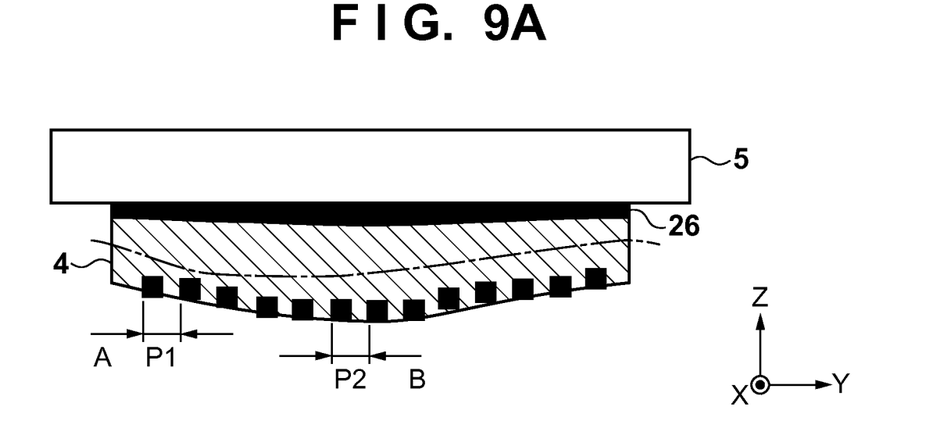
FIG. 9A is a view for explaining a method of obtaining a correction value by calculation.
Figure 9B:
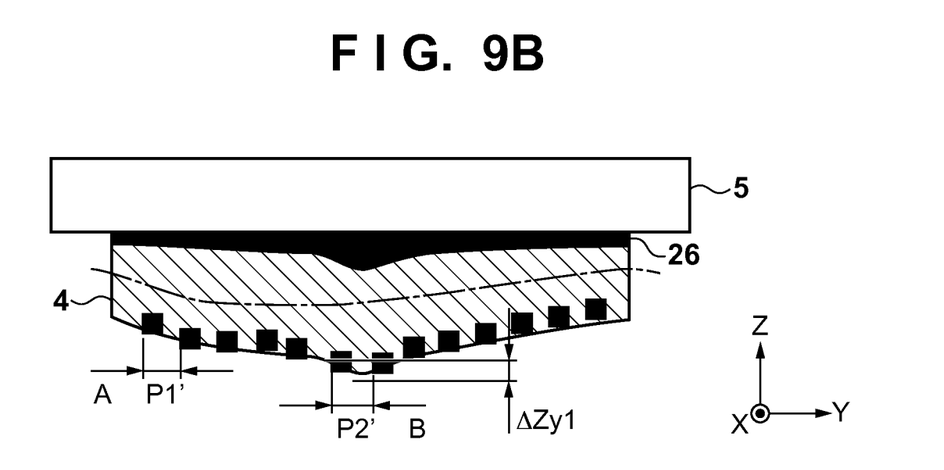
FIG. 9B is a view for explaining the method of obtaining the correction value by calculation.

The method of obtaining a correction value by calculation will be described with reference to FIGS. 9A and 9B. A case in which the scale 4 has partially deformed will be explained. FIG. 9A shows the scale 4 at the first timing. FIG. 9B shows the scale 4 at the second timing. In FIGS. 9A and 9B, assume that the scale 4 has been attached to the plate 5 by an adhesive 26. Assume also that the scale 4 shown in FIG. 9B has deformed in the Z direction by $\Delta Z_{y1}$ in a portion B, as compared with the scale 4 shown in FIG. 9A. In this case, in a portion A where no deformation has occurred in the Z direction, an interval P1 between the lines does not temporally change in the Y direction (P1=P1'). On the other hand, in the portion B where deformation has occurred in the Z direction, an interval P2 between the lines temporally changes in the Y direction (P2≠P2'). That is, when the portion B of the scale 4 deforms in the Z direction, the interval between the lines expands in the Y direction by P2'−P2 in the portion B. In this case, the control unit 20 obtains, for example, information (for example, a relational expression) indicating the relationship between the deformation amount ΔZ of the scale 4 in the Z direction and a change amount ΔE (=P2'−P2) of the interval between the lines. The control unit 20 can obtain, based on the information, the change amount ΔE of the interval between the lines from the deformation amount ΔZ of the scale 4 in the Z direction which has been obtained based on the measurement results of the measurement unit, and set the obtained change amount ΔE as a correction value. The information indicating the relationship between the deformation amount ΔZ and the change amount ΔE can be obtained in advance by, for example, experiment or simulation. In the first embodiment, the obtained change amount ΔE is set as a correction value. For example, a coefficient by which the displacement amount of the stage 2 obtained from the output of the encoder is multiplied may be obtained according to P2/(P2+ΔE(y)), and set as a correction value.

As described above, the exposure apparatus 100 of the first embodiment includes the measurement units 11 each for measuring the surface shape of the corresponding scale 4 of the encoder. The exposure apparatus 100 obtains a deformation amount indicating the temporal change of the surface shape of each scale 4 by causing each measurement unit 11 to measure the surface shape of the scale 4 at different timings, and specifies, based on the deformation amount, a range within which the detection value of the encoder is corrected (updated). In this way, it is possible to efficiently calibrate the encoder by measuring the surface shape of each scale 4 and specifying a range within which a correction value is corrected.

Figure 10:
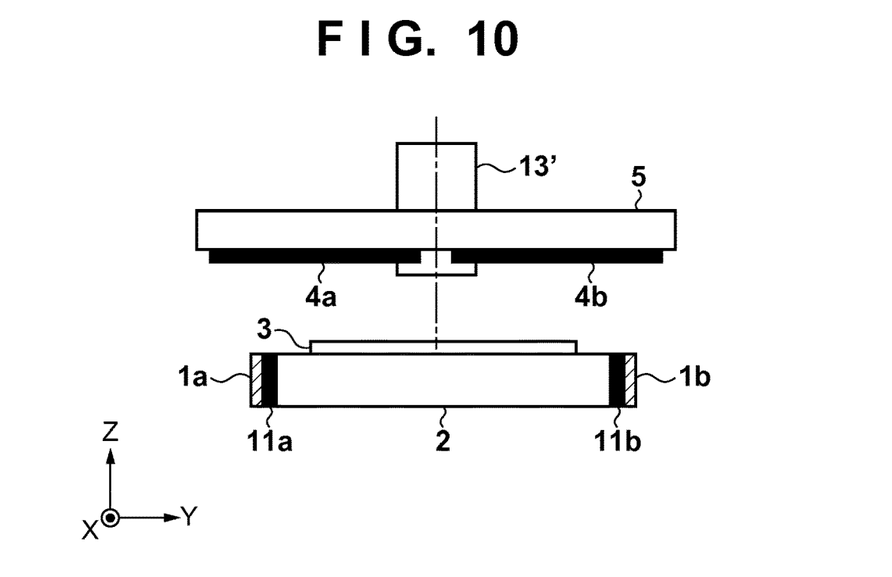
FIG. 10 is a view showing the arrangement of an alignment scope and its peripheral components.

The exposure apparatus 100 of the first embodiment adopts the TTL scheme in which the alignment scope 13 is used to detect the marks on the reference substrate via the projection optical system 6. The scale 4 is, therefore, attached to the plate 5 fixed to the projection optical system 6. The present invention, however, is not limited to this. For example, when detecting the marks on the reference substrate by the off-axis scheme, an alignment scope 13' different from the alignment scope 13 used in the TTL scheme is arranged beside the projection optical system 6. In this case, as shown in FIG. 10, scales 4 are arranged in the alignment scope 13'. The scales 4 arranged in the alignment scope 13' can be attached to a plate 5' fixed to the alignment scope 13'.

Second Embodiment

Figure 11:
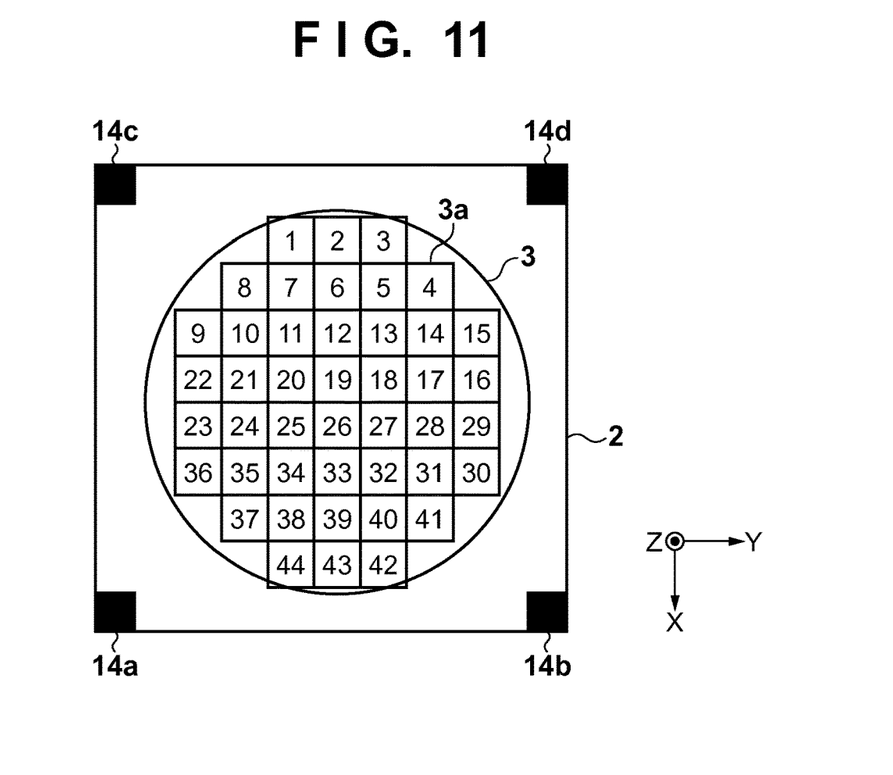
FIG. 11 is a view showing a stage and a substrate held by the stage when viewed from the Z direction.
Figure 12:
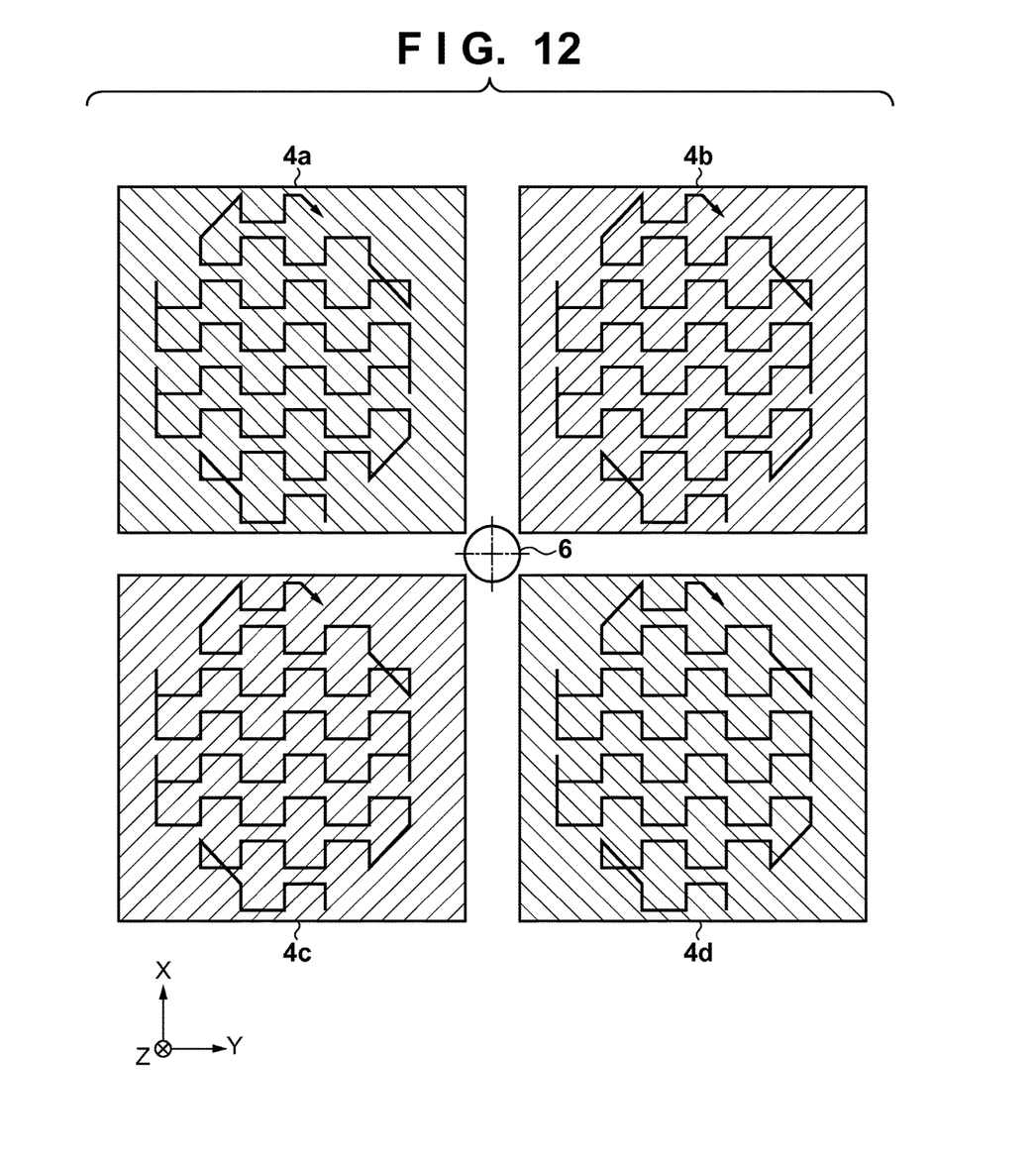
FIG. 12 is a view showing a scale when viewed from the −Z direction.

In the second embodiment, a method of deciding a region of a scale where a measurement unit 11 measures a surface shape will be described with reference to FIGS. 11 and 12. FIG. 11 is a view showing a stage 2 and a substrate 3 held by the stage 2 when viewed from the Z direction. A plurality of plurality of shot regions 3a are formed on the substrate 3, and numbers given to the shot regions 3a indicate the order of performing exposure processing. The measurement unit 11 and a light receiving unit 1 of an encoder are arranged at each of four corners 14a to 14d of the stage 2. FIG. 12 is a view showing scales 4a to 4d when viewed from the −Z direction. The scales 4a to 4d are arranged outside a projection optical system 6 so as to correspond to the light receiving units 1 arranged at the four corners 14a to 14d of the stage 2, respectively. In each scale 4, a plurality of lines are arranged so as to enable the light receiving unit 1 to detect the displacement amount of the stage 2 in the X and Y directions.

If exposure processing is performed for the respective shot regions 3a formed on the substrate 3 in the order indicated in FIG. 11, light with which each light receiving unit 1 irradiates the corresponding scale 4 moves through a path indicated by an arrow in FIG. 12. The arrangement of the plurality of shot regions 3a formed on the substrate 3 is determined for, for example, each lot or each exposure layer. Therefore, unless lots or exposure layers change, the path of light with which the light receiving unit 1 irradiates the scale 4 does not change. That is, the measurement unit 11 need only measure the surface shape within a region 19 including the path of light in steps S3 and S6 of FIG. 2 unless the lots or exposure layers change. In other words, a control unit 20 can determine the region 19 where the measurement unit 11 measures the surface shape in accordance with the arrangement of the plurality of shot regions 3a formed on the substrate 3. This makes it possible to more efficiently calibrate the encoder.

Third Embodiment

Figure 13:
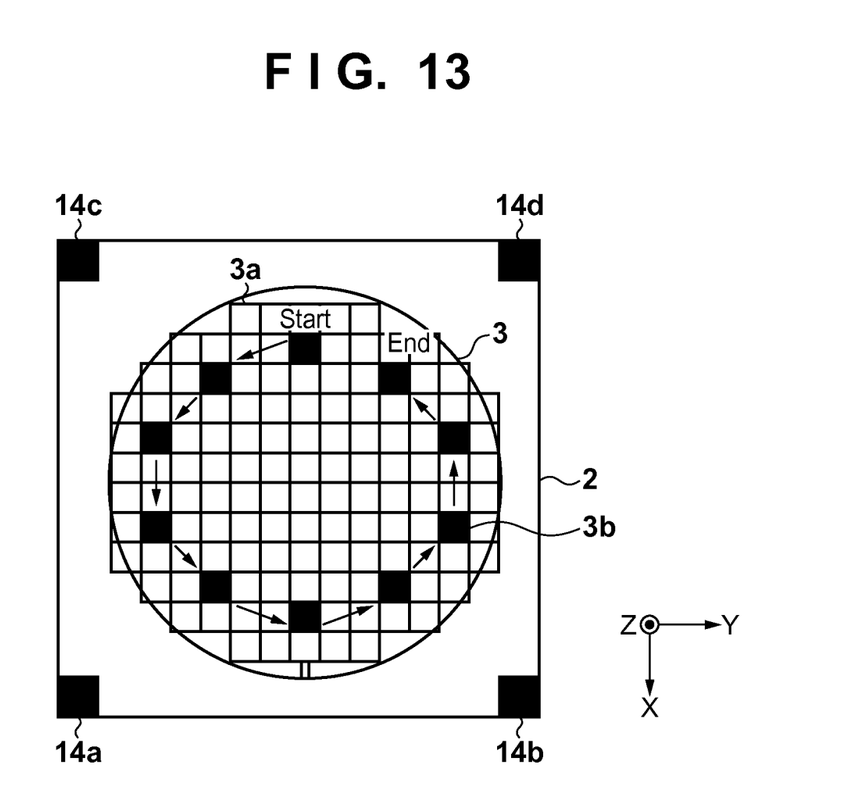
FIG. 13 is a view showing a stage and a substrate held by the stage when viewed from the direction.

In the third embodiment, a method of deciding a region of a scale 4 where a measurement unit 11 measures a surface shape when an alignment scope 13' is arranged as shown in FIG. 10 will be described. FIG. 13 is a view showing a stage 2 and a substrate 3 held by the stage 2 when viewed from the Z direction. A plurality of shot regions 3a are formed on the substrate 3. Among the plurality of shot regions 3a, a shot region filled with black indicates a shot region (to be referred to as a target shot region 3b hereinafter) to undergo alignment measurement at the time of performing global alignment. The measurement unit 11 and a light receiving unit 1 of an encoder are arranged at each of four corners 14a to 14d of the stage 2.

Figure 14:
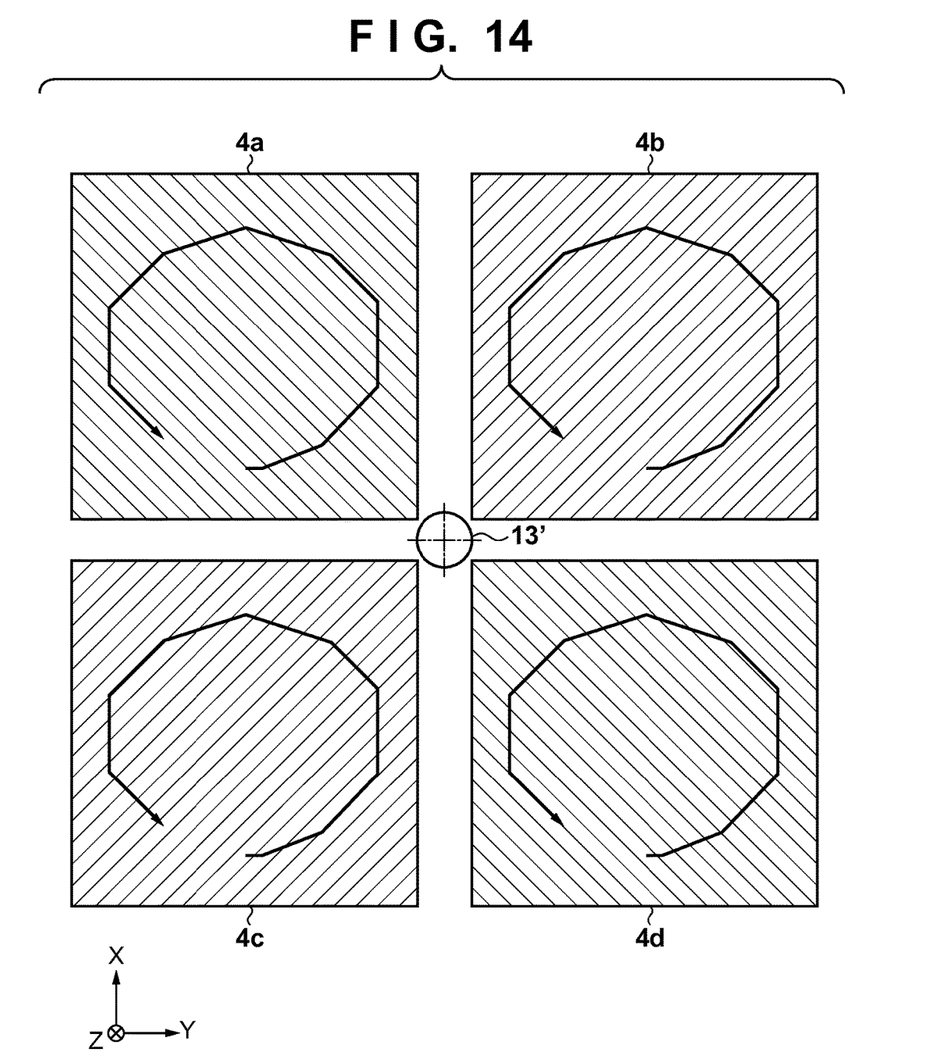
FIG. 14 is a view showing a scale when viewed from the −Z direction.

In global alignment, alignment measurement is performed for the respective target shot regions 3b formed on the substrate 3 in, for example, an order indicated by arrows in FIG. 13. In this case, light with which each light receiving unit 1 irradiates the corresponding scale 4 moves through a path indicated by an arrow in FIG. 14. FIG. 14 is a view showing scales 4a to 4d when viewed from the −Z direction. Note that the arrangement of the plurality of shot regions 3a formed on the substrate 3 is determined for, for example, each lot or each exposure layer, and the arrangement of the target shot regions 3b is also determined for each lot or each exposure layer. Therefore, unless lots or exposure layers change, the path of light with which the light receiving unit 1 irradiates the scale 4 does not change. That is, the measurement unit 11 need only measure the surface shape on the path of light in steps S3 and S6 of FIG. 2 unless the lots or exposure layers change. In other words, a control unit 20 can determine a region where the measurement unit 11 measures the surface in accordance with the arrangement of the target shot regions 3b formed on the substrate 3.

Figure 15A:
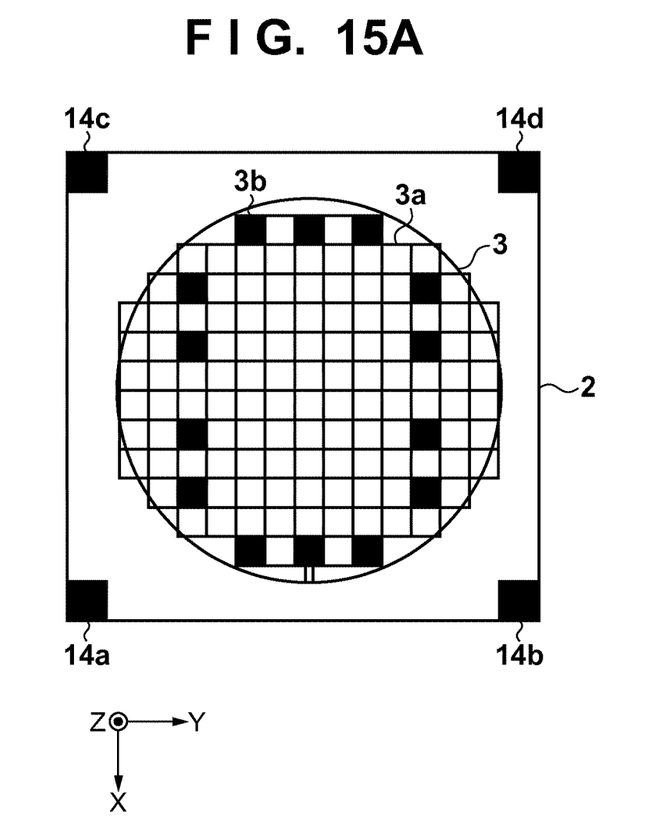
FIG. 15A is a view showing a stage and a substrate held by the stage when viewed from the Z direction.
Figure 15B:
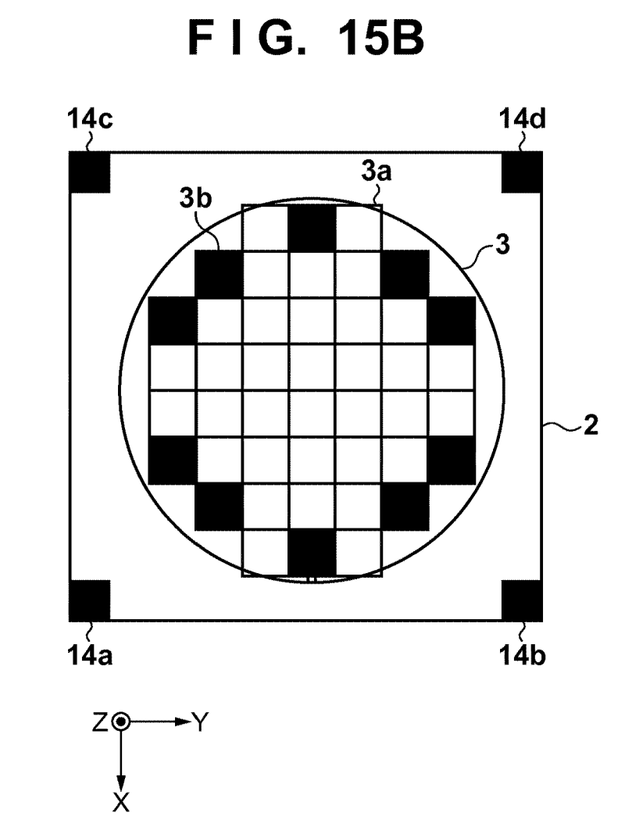
FIG. 15B is a view showing the stage and the substrate held by the stage when viewed from the direction.

For example, FIGS. 15A and 15B are views each showing the substrate 3 and the stage 2 holding the substrate 3 when viewed from the Z direction, in which the arrangement of the plurality of shot regions 3a is different from that shown in FIG. 13. As the arrangement of the plurality of shot regions 3a changes, the arrangement of the target shot regions 3b also changes. As described above, as the arrangement of the target shot regions 3b changes, the path of light with which the light receiving unit 1 irradiates the scale changes according to the arrangement. Consequently, the region where the measurement unit 11 measures the surface shape is also changed.

<Embodiment of Method of Manufacturing Article>.

A method of manufacturing an article according to an embodiment of the present invention is suitable for manufacturing an article, for example, a microdevice such as a semiconductor device or an element having a microstructure. The method of manufacturing an article according to this embodiment includes a step of forming a latent image pattern on a photosensitive agent applied on a substrate by using the above-described can exposure apparatus (a step of exposing the substrate), and a step of developing the substrate on which the latent image pattern is formed in the above step. This manufacturing method further includes other well-known steps (for example, oxidation, film formation, deposition, doping, planarization, etching, resist removal, dicing, bonding, and packaging). When compared to the conventional methods, the method of manufacturing an article according to this embodiment is advantageous in at least one of the performance, quality, productivity, and production cost of an article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-143894 filed on Jul. 9, 2013, which is hereby incorporated by reference herein in its entirety.

What is claimed is:

1. A method for calibrating an encoder which includes a scale and a light receiving unit configured to receive light reflected by the scale, and detects a change in relative position between the scale and the light receiving unit in a detection direction, the method comprising:
   a first measurement step of measuring a height at a plurality of positions on the scale at a first time;
   a second measurement step of measuring a height at a plurality of positions on the scale deformed after the first time at a second time;
   a determination step of determining, based on the measurement difference between a measurement result in the first measurement step and a measurement result in the second measurement step, whether the scale is deformed by expansion of the entire scale in the detection direction or by partial deformation of the scale;
   a specifying step of specifying, based on the determination result in the determination step, a correction range within which a detection value of the encoder is corrected; and
   a determination step of determining a correction value for correcting the detection value of the encoder within the correction range specified in the specifying step,
   wherein the specifying step includes:
   specifying the entirety of the scale as the correction range when it is determined that the scale is deformed by expansion of the entire scale in the detection direction,
   specifying a range which is narrower than that of the entire scale and includes a portion of partial deformation of the scale as the correction range when it is determined that the scale is deformed by the partially deformation of the scale without the expansion of the entire scale in the detection direction.

2. The method according to claim 1, further comprising a determination step of determining whether to perform the second measurement step.

3. The method according to claim 1, wherein
   the scale includes a line pattern regularly arranged, and in the determination step, the correction value is determined so as to decrease detection errors of the encoder which are caused by a change in interval between a plurality of lines of the line pattern.

4. The method according to claim 3, wherein in the determination step, based on information indicating a relationship between the deformation amount obtained from the measurement difference and the change in the interval, a change amount of the interval is obtained from the deformation amount, and the obtained change amount of the interval is determined as the correction value.

5. The method according to claim 1, wherein in the first and second measurement step, a deformation amount of a surface shape of the scale is obtained as the measurement result.

6. The method according to claim 1, wherein in the first measurement step and the second measurement step, an interferometer is used.

7. A measurement apparatus for measuring a displacement of an object, comprising:
   an encoder including a scale and a light receiving unit which is configured to receive light reflected by the scale, and configured to detect a change in relative position between the scale and the light receiving unit in a detection direction;
   a measurement unit configured to measure a height at a plurality of positions on the scale at a first time and measure a height at a plurality of positions on the scale deformed after the first time at a second time; and
   a control unit configured to determine, based on the measurement difference between a measurement result at the first time and a measurement result at the second time, whether the scale is deformed by expansion of the entire scale in the detection direction or partially by partial deformation of the scale,
   wherein the control unit specifies, based on the determination result, a correction range within which a detection value of the encoder is corrected, and determines a correction value for correcting the detection value of the encoder within the specified correction range, and
   wherein the specifying by the control unit includes:
   specifying the entirety of the scale as the correction range when it is determined that the scale is deformed by expansion of the entire scale in the detection direction, and
   specifying a range which is narrower than that of the entire scale and includes a portion of partial deformation of the scale as the correction range when it is determined that the scale is deformed by the partial deformation of the scale without the expansion of the entire scale in the detection direction.

8. An exposure apparatus for exposing a substrate, comprising:
   a projection optical system configured to project a pattern of a mask onto the substrate;
   a stage configured to be movable while holding the substrate; and
   a measurement apparatus defined in claim 7,
   wherein the measurement apparatus measures a displacement of the stage as the displacement of the object.

9. The apparatus according to claim 8, wherein
   the substrate includes a plurality of shot regions, and
   a control unit determines, based on an arrangement of the plurality of shot regions, a region of a scale where the measurement unit measures the deformation amount.

10. The apparatus according to claim 7, wherein the measurement unit obtains the deformation amount of a surface shape of the scale as the measurement result.

11. A method of manufacturing an article, the method comprising:
    exposing a substrate using an exposure apparatus;
    developing the exposed substrate; and
    processing the developed substrate to manufacture the article, wherein the exposure apparatus includes:

a projection optical system configured to project a pattern of a mask onto the substrate;

a stage configured to be movable while holding the substrate; and a measurement apparatus configured to measure a displacement of the stage, wherein the measurement apparatus includes:

an encoder including a scale and a light receiving unit which is configured to receive light reflected by the scale, and configured to detect a change in relative position between the scale and the light receiving unit in a detection direction;

a measurement unit configured to measure a height at a plurality of positions on the scale at a first time and measure a height at a plurality of positions on the scale deformed after the first time at a second time; and a control unit configured to determine, based on the measurement difference between a measurement result at the first time and a measurement result at the second time, whether the scale is deformed by expansion of the entire scale in the detection direction or by partial deformation of the scale, wherein the control unit specifies, based on the determination result, a correction range within which a detection value of the encoder is corrected, and determines a correction value for correcting the detection value of the encoder within the specified correction range, and wherein the specifying by the control unit includes:

specifying the entirety of the scale as the correction range when it is determined that the scale is deformed by expansion of the entire scale in the detection direction, and specifying a range which is narrower than that of the entire scale and includes a portion of partial deformation of the scale as the correction range when it is determined that the scale is deformed by the partial deformation of the scale without the expansion of the entire scale in the detection direction.

12. The method according to claim 11, wherein the measurement unit obtains the deformation amount of a surface shape of the scale.

\* \* \* \* \*